United States Patent [19]

Berger et al.

[11] 4,365,217

[45] Dec. 21, 1982

[54] CHARGE-TRANSFER SWITCHED-CAPACITY FILTER

[75] Inventors: Jean L. Berger; Jean L. Coutures, both of Paris, France

[73] Assignee: Thomson-CSF, Paris, France

[21] Appl. No.: 210,141

[22] Filed: Nov. 24, 1980

[30] Foreign Application Priority Data

Nov. 30, 1979 [FR] France ................................ 79 29506

[51] Int. Cl.³ ...................... H03H 19/00; G11C 27/02
[52] U.S. Cl. ...................................... 333/165; 333/173
[58] Field of Search ................. 333/165, 173; 328/167; 307/221 D

[56] References Cited

U.S. PATENT DOCUMENTS

4,047,051 9/1977 Heller .............................. 307/221 D
4,070,667 1/1978 Eichelberger ................... 307/221 D
4,072,939 2/1978 Heller et al. ..................... 307/221 D

FOREIGN PATENT DOCUMENTS

2437734 4/1980 France .

OTHER PUBLICATIONS

Schweer et al., "MOS Schalter-Kondensator-Filter mit Spannungsumkehrschaltern", Nachrichten Elektronik, vol. 33, No. 19, Oct. 1979, pp. 321-326.
Hewes et al., "Applications of CCD and Switched Capacitor Filter Technology", Proceedings of the IEEE, vol. 67, No. 10, Oct. 1979, pp. 1403-1415.
Smith, "MOS Technology Offers the Most for the Least", Bell Laboratories Record, Nov. 1976, pp. 282-285.
Webster's Seventh New Collegiate Dictionary, G & C Merriam Company, Springfield, Mass., Copyrighted 1961, p. 54, Title Page.

*Primary Examiner*—Marvin L. Nussbaum
*Attorney, Agent, or Firm*—Roland Plottel

[57] ABSTRACT

A switched capacity filter having capacities formed by MOS technology on a semiconductor substrate. The connection between two capacities whose first plates are formed by the semiconductor substrate are periodically connected by providing transfer of charges in the substrate on which these two capacities are integrated. The external or other plate of each capacity receives, the input voltage, or a reference voltage, or the surface potential under another capacity which is provided by a reinjection and reading device formed from a diode and a voltage follower stage.

11 Claims, 8 Drawing Figures

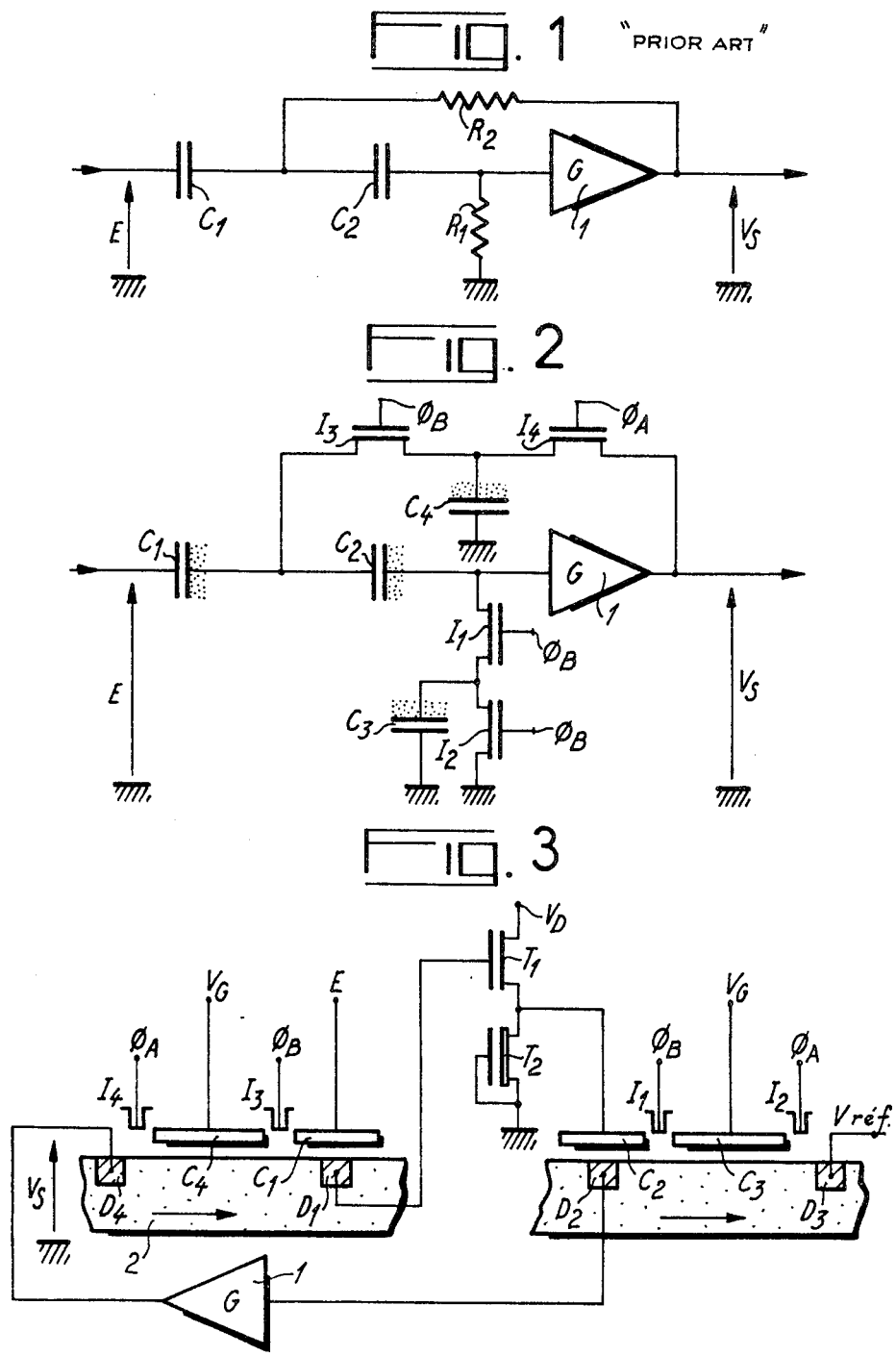

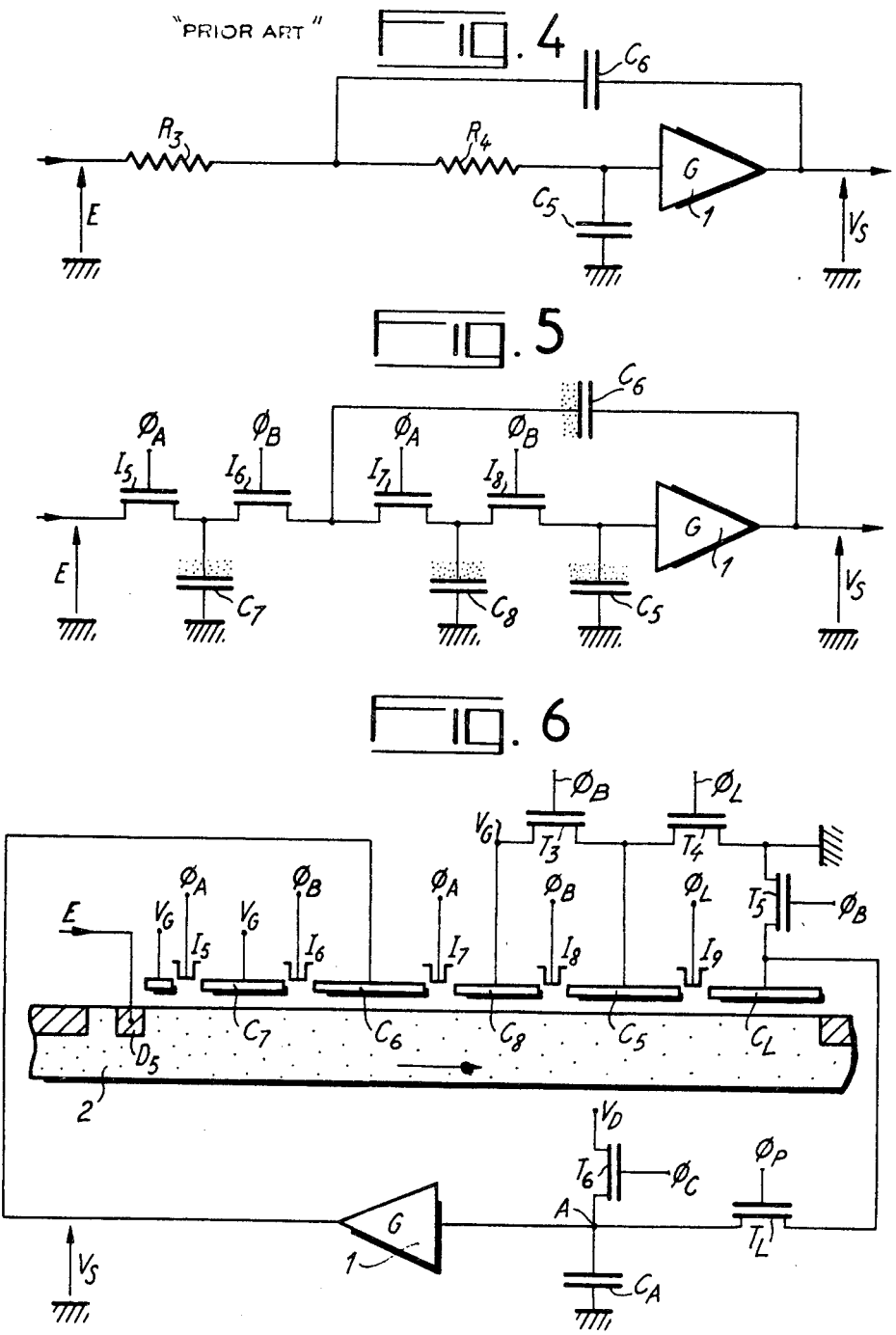

CHARGE-TRANSFER SWITCHED-CAPACITY FILTER

BACKGROUND OF THE INVENTION

The present invention relates to a charge-transfer switched-capacity filter.

Switched-capacity filters are known particularly from two articles in the American review "IEEE Journal of Solid-State Circuits", volume SC-12, No. 6, Dec. 1977, pages 592 to 608.

Switched-capacity filters comprise generally an amplifier associated with a network of resistors and capacities in which each resistor is formed by the series connection of two MOS switches and by a capacity between the common point between these switches and a reference voltage.

SUMMARY OF THE INVENTION

The present invention relates to a switched-capacity filter in which the capacities are formed by MOS technology and the MOS switches are formed by grids astride the MOS capacities from which they are separated by an oxide layer.

One plate of each MOS capacity is then formed by the semiconductor substrate on which this capacity is integrated and the connection between two MOS capacities whose plates formed by the substrate are periodically connected, depending on the electrical diagram of the filter, is provided by charge transfer in the semiconductor substrate on which these two capacities are integrated and results in the establishment of the same surface potential under these two capacities. This is why the filter of the invention is called a charge-transfer switched-capacity filter.

The other plate of each MOS capacity, which is then external to the substrate, receives, depending on the point where it is connected in the electrical diagram of the filter, either the input voltage of the filter E, or a DC voltage $V_G$ taken for reference. In the case where the external plate is connected in the electrical diagram, periodically or permanently, and directly or through the amplifier, to the plate formed by the substrate of another capacity, this external plate receives through a reading and reinjecting device the surface potential under this other capacity.

The present invention allows a filter whose electrical diagram is commonplace and only comprises resistors and capacities associated with an amplifier to be transformed into a charge-transfer switched-capacity filter. Thus, charge-transfer switched-capacity filters of any order may be obtained by placing in series filters of the first and second orders.

Charge-transfer switched-capacity filters present, particularly with respect to known switched-capacity filters, the advantage of not comprising any parasite capacities on the capacities of the network associated with the amplifier. Thus, low values may be used for the capacities of the network and the cost thereof may be reduced and the compactness increased.

DESCRIPTION OF THE DRAWINGS

Other objects, characteristics and results of the invention will become clear from the following description, given by way of non-limiting example and illustrated by the accompanying figures which represent:

FIG. 1, the electrical diagram of a high-pass filter of the second order;

FIG. 2, the diagram of a switched-capacity filter corresponding to the filter of FIG. 1;

FIG. 3, one embodiment in accordance with the invention of a charge-transfer switched-capacity filter corresponding to the filter of FIGS. 1 and 2;

FIG. 4, the electrical diagram of a low-pass filter of the second order;

FIG. 5, the diagram of the switched-capacity filter corresponding to the filter of FIG. 4;

FIG. 6, one embodiment in accordance with the invention of a charge-transfer switched-capacity filter corresponding to the filter of FIGS. 4 and 5;

In the different figures, the same references designate the same parts, but for the sake of clarity, the sizes and proportions of the different parts have not been respected.

DESCRIPTION OF THE PREFERRED EMBODIMENTS

Figure 7:
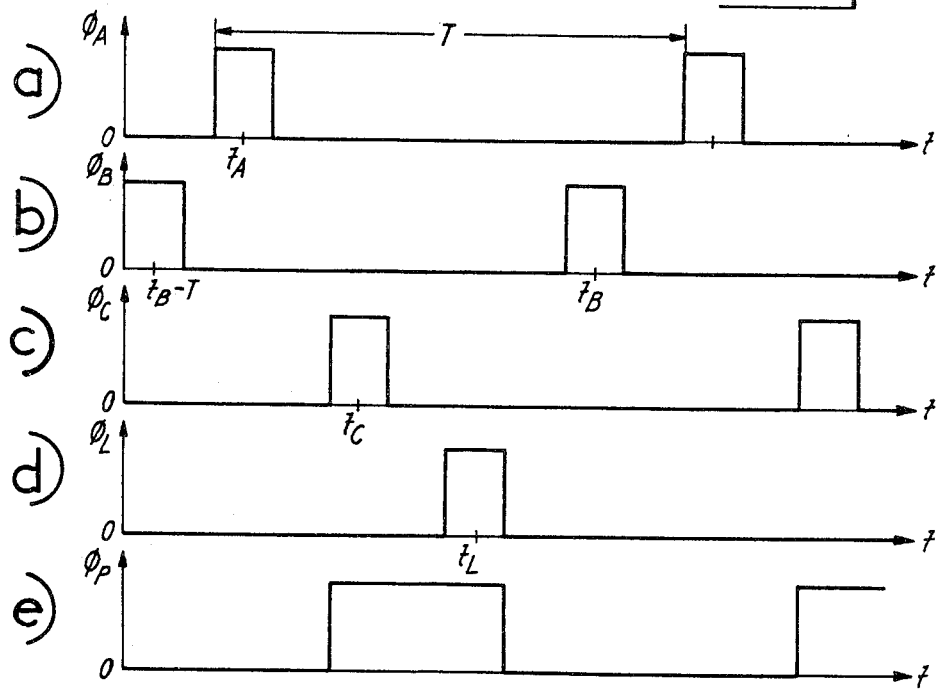
FIG. 7, part $a$ to $e$, phase diagrams of signals able to be applied to the filters of the invention.

FIG. 1 shows the electrical diagram of a high-pass filter of the second order.

This filter is formed from two capacities $C_1$ and $C_2$ in series with the input of an amplifier 1 with gain G. A resistor $R_1$ is connected between the input of the amplifier and ground, whereas another resistor $R_2$ ensures looping of the filter by connecting the output of the amplifier to the common point between capacities $C_1$ and $C_2$.

We will call E the input voltage of the filter and $V_S$ its output voltage.

FIG. 2 shows the diagram of the switched-capacity filter corresponding to the filter of FIG. 1.

The resistors $R_1$ and $R_2$ of the filter of FIG. 1 are formed by placing in series two MOS switches, respectively $I_1$, $I_2$, and $I_3$, $I_4$, receiving control signals $\phi_A$ and $\phi_B$, and by a capacity, respectively $C_3$ and $C_4$, between the point common to both switches and ground.

In FIG. 2 there has been shown symbolically by a few dots, which plate of capacities $C_1$ to $C_4$ would be formed by the semiconductor substrate in the charge-transfer switched-capacity filter of the invention. In the filter of the invention, there will then be formed by the substrate the plate of capacity $C_1$, other than the one which receives the input voltage E in accordance with the electrical diagram, the plates of $C_3$ and $C_4$ other than those connected to ground according to the electrical diagram and finally the plate of capacity $C_2$ which is connected to amplifier 1.

FIG. 3 shows one embodiment in accordance with the invention of a charge-transfer switched-capacity filter corresponding to the filter of FIGS. 1 and 2.

The capacities of the filter are formed by MOS technology, i.e. they are formed by a metal electrode, separated by an oxide layer (which is not shown in the figure for the sake of clarity) from a semiconductor substrate 2, which is generally silicon. One of the plates of each MOS capacity is then formed by the substrate on which it is integrated.

The MOS switches of the filter are formed by grids astride the MOS capacities from which they are separated by an additional oxide layer (which is not shown in the figure also for the sake of clarity).

When a high potential is applied to one of these switches, a charge-transfer connection is effected between the two capacities adjacent this switch. The same surface potential is finally established under these two capacities.

On the same semiconductor substrate we find integrated one after the other, depending on the charge-transfer direction indicated by an arrow, the capacities $C_4$ and $C_1$ separated by switch $I_3$ controlled by the signal $\phi_B$. In the diagram of FIG. 2, the plates formed by the substrate of capacities $C_1$ and $C_4$ are periodically connected by MOS switch $I_3$ controlled by $\phi_B$. These capacities are then integrated on the same semiconductor substrate and the connection therebetween takes place by charge-transfer in the substrate through $I_3$. Since the other plate of capacity $C_4$ is connected, according to the diagram of FIG. 2, to ground, it receives a DC voltage $V_G$ taken for reference. The other plate of capacity $C_1$ receives, as shown in FIG. 2, the input voltage of the filter E. Capacities $C_2$ and $C_3$ whose plates formed by the substrate are periodically connected by switch $L_1$ controlled by $\phi_B$ in FIG. 2 are integrated on the same semiconductor substrate 2 as that which bears $C_4$ and $C_1$ but are isolated from the zone of the substrate which carries $C_4$ and $C_1$.

The other plate of $C_3$ connected to ground in FIG. 2 receives the voltage $V_G$.

The other plate of $C_2$ which is connected according to the diagram of FIG. 2 to the plate formed by the substrate of $C_1$ receives the surface potential under $C_1$ through a reading and reinjection device.

In the case of FIG. 3, the reading and reinjection device is formed by a voltage-follower stage whose input is connected to a diode $D_1$ diffused in the substrate under $C_1$ and whose output is connected to the external plate of $C_2$.

The voltage-follower stage may be formed, as shown in FIG. 3, by two MOS transistors, an enrichment transistor $T_1$ and a depletion transistor $T_2$, in series between a supply voltage $V_{DD}$ and ground. The input takes place on the grid of $T_1$ connected to $V_{DD}$ and the output takes place on the electrode common to $T_1$ and $T_2$, whereas the grid of $T_2$ is connected to ground.

In FIG. 2, it can be seen that the plate formed by the substrate of the capacity $C_2$ is connected through the gain amplifier G and a switch $I_4$ controlled by the signal $\phi_A$ to the plate formed by the substrate of capacity $C_4$.

In the case of FIG. 3, that is achieved by means of a charge-injection and reading device formed by a diode $D_2$ injected under $C_2$ and a voltage-follower stage connected to the input of the gain amplifier G. The output of the amplifier is connected to a charge-injection diode $D_4$, diffused in the same substrate as $C_4$ and $C_1$ and downstream, in the charge-transfer direction, of $C_4$ from which it is separated by switch $I_4$ controlled by $\phi_A$.

The voltage-follower stage is generally included in gain amplifier G and, in FIG. 3, only this amplifier is shown.

In FIG. 2, it can be seen that the plate formed by the substrate of $C_3$ is periodically connected through a switch $I_2$ controlled by $\phi_A$ to ground.

In the case of FIG. 3, that is achieved by disposing after $C_3$ on the same substrate a switch $I_2$ controlled by $\phi_A$ and a diode $D_3$ permanently connected to a reference potential $V_{ref}$ which may be the ground of the filter.

There will now be described the transfer function of the filter of the invention, shown in FIG. 3.

It should first of all be noted that the clock signals $\phi_A$ and $\phi_B$ applied to the MOS switches of this filter are shown in FIGS. 7a and 7b. The signals $\phi_A$ and $\phi_B$ vary substantially as a square wave between a low level and a high level with a period T. Furthermore, $\phi_A$ and $\phi_B$ are not simultaneous at the high level. We will call $t_A$ the time when $\phi_A$ is at the high level and $t_B$ the time when $\phi_B$ is at the high level.

The same input voltage E is maintained on $C_1$ between two successive times $t_B$ and changes at times $t_B$. At time $t_A$, $\phi_A$ is at the high level and $\phi_B$ at the low level. The surface potential under $C_4$ and under $C_3$ is written:

$$\phi_{S4}(t_A) = G \cdot \phi_{S2}(t_B - T) \text{ and } \phi_{S3}(t_A) = V_{ref}.$$

The conservation of the total quantity of charges on the one hand under $C_4$ and $C_1$ and on the other hand under $C_2$ and $C_3$ between times $t_A$ and $t_B$ may furthermore be written:

$$C_4[V_G - G\phi_{S2}(t_B - T)] + C_1[E(t_B - T) - \phi_{S1}(t_B - T)]$$
$$= C_4[V_G - \phi_{S1}(t_B)] + C_1[E(t_B) - \phi_{S1}(t_B)]$$

$$C_2[\phi_{S1}(t_B - T) - \phi_{S2}(t_B - T)] + C_3(V_G - V_{ref}) = C_2[\phi_{S1}(t_B) - \phi_{S2}(t_B)] + C_3[V_G - \phi_{S2}(t_B)]$$

Passing into the Z plane and eliminating $\phi_{S1}$ from these two relationships, we obtain:

$$\frac{V_S}{E} = \frac{G\phi_{S2}}{E} = \frac{(Z^{-1} - 1)^2}{AZ^{-2} - BZ^{-1} + C}$$

where A, B and C are constants which are expressed as a function of G and $C_1$, $C_2$, $C_3$, $C_4$.

It can then be seen that the transfer function at Z obtained is that of a high-pass filter.

FIG. 4 shows the electrical diagram of a low-pass filter of the second order, of the Sallen-Key type, dual with that shown in FIG. 1.

This filter comprises two resistors $R_3$ and $R_4$ in series with the input of amplifier 1 with gain G. A capacity $C_5$ is connected between the input of the amplifier and ground. Finally, a capacity $C_6$ between the output of the amplifier and the common point between $R_3$ and $R_4$ ensures looping of the filter.

FIG. 5 shows the diagram of the switched-capacity filter corresponding to the diagram of FIG. 4.

Resistors $R_3$ and $R_4$ are formed by placing in series two switches, respectively $I_5$, $I_6$ and $I_7$, $I_8$ and by a capacity respectively $C_7$ and $C_8$ between the point common to the switches and ground.

There is shown symbolically by a few dots that the plates of $C_5$, $C_7$, $C_8$, other than those connected to ground in accordance with the electrical diagram, would be formed by the semiconductor substrate of the filter of the invention. Similarly, it has been shown symbolically that the plate of $C_6$ other than the one connected to the output of the amplifier would be formed by the semiconductor substrate.

FIG. 6 shows one embodiment in accordance with the invention of a charge-transfer switched-capacity filter corresponding to the filter of FIGS. 4 and 5.

We find aligned on the same substrate, in the charge-transfer direction as shown by an arrow, the capacities $C_7$, $C_6$, $C_8$, $C_5$ and a reading capacity $C_l$. Each of these capacities is separated from the next one by a switch $I_6$, $I_7$, $I_8$, $I_9$.

Switch $I_7$ is controlled by $\phi_A$, switches $I_6$ and $I_8$ are controlled by $\phi_B$ and finally switch $I_9$ is controlled by a signal $\phi_L$.

The external plate of capacities $C_7$ and $C_8$ is connected directly to $V_G$. The external plate of $C_5$ is periodically connected to $V_G$ through an MOS transistor $T_3$ controlled by the signal $\phi_B$.

The input voltage E is applied to a diffused diode $D_5$, downstream of $C_7$, from which it is separated by a capacity brought up to $V_G$ and by a switch $I_5$ controlled by $\phi_A$.

In the diagram of FIG. 5, the plate formed by the substrate of $C_5$ is connected through the amplifier to the external plate of $C_6$. That is achieved in FIG. 6 by a reinjection and reading device connected between $C_5$ and the amplifier, the output of the amplifier being connected to the external plate of $C_6$.

The reinjection and reading device shown in FIG. 6 comprises:

- the reading capacity $C_l$ separated from $C_5$ by switch $I_9$ controlled by $\phi_L$;
- an MOS transistor $T_4$ connected between the external plate of $C_5$ and ground and controlled by $\phi_L$;
- a stage formed by an MOS transistor $T_L$ controlled by a signal $\phi_P$ and connected between the external plate of $C_l$ and the input of the amplifier at a point A. To point A are also connected a capacity $C_A$ which is also connected to ground and a transistor $T_6$ controlled by a signal $\phi_C$, and connected to the supply voltage $V_D$;
- finally, a transistor $T_5$ controlled by $\phi_B$ is connected between the external plate of $C_l$ and ground.

In FIGS. 7c, 7d and 7e, there is shown after $\phi_A$ and $\phi_B$, the clock signals $\phi_C$, $\phi_L$ and $\phi_P$. These signals, like $\phi_A$ and $\phi_B$, vary substantially as a square wave between a low level and a high level with a period T.

The signals $\phi_A$, $\phi_B$, $\phi_C$ and $\phi_L$ are never simultaneously at the high level. In chronological order, $\phi_A$, $\phi_C$, $\phi_L$ are at the high level then $\phi_B$ and then again $\phi_A$, $\phi_C$...

Signal $\phi_P$ is at the high level from the time when $\phi_C$ passes to the high level to the time when $\phi_L$ passes to the low level.

Finally, we will call $t_C$ and $t_L$ the times when $\phi_C$ and $\phi_L$ are at the high level.

There will now be explained the operation of the reinjection and reading device.

At time $t_C$, $\phi_C$ and $\phi_P$ are at the high level. Transistor $T_6$ conducts and causes capacity $C_A$ to be charged to a level $V_{AO}=V_D$ such that transistor $T_L$, whose grid receives $\phi_P$, is biased to saturation. The reading capacity $C_l$ then receives from $T_L$ on its external plate a voltage equal to $V_{\phi P}-V_{TL}$, where $V_{\phi P}$ represents the high level of the signal $\phi_P$ and $V_{TL}$ the threshold voltage of $T_L$.

At time $t_L$, $\phi_L$ and $\phi_P$ are at the high level. Transistor $T_4$ conducts and connects the external plate of $C_5$ to ground. The inversion charge present under $C_5$ is transferred through switch $I_9$ which is conducting under $C_L$.

The external plate of $C_L$ is maintained at a constant potential by $T_L$ which is still saturated, which causes capacity $C_A$ to be discharged and the potential at point A to be modified.

The potential of point A a time $t_L$ is therefore written:

$$V_A(t_L) = V_{AO} - \frac{Q_5(t_B - T)}{C_A}$$

where $Q_5(t_B-T)$ represents the charge present under $C_5$ at the end of the preceding cycle, by making the approximation that a space charge under $C_L$ at time $t_L$ is not very different from that existing under $C_5$ at time $t_B-T$, which is justified particularly if $C_5=C_L$, which is the case in FIG. 6.

The maintenance of a constant potential on the external plate of $C_L$ during the transfer of the charges to be read under this capacity allows reading of the surface potential under $C_L$, and so under $C_5$, at point A.

To assure proper operation of the filter, amplifier 1 must comprise a continuous-level translator stage so that:

$$V_S(t_L) = V_G - \frac{Q_5(t_B - T)}{C_A}$$

In fact, at time $t_A$, a common-surface potential is established between $C_6$ and $C_8$. For it to be possible to establish this common-surface potential, it is preferable for the voltage applied to $C_6$ in the absence of a reading signal to be the same as that applied to $C_8$, i.e. the reference voltage $V_G$.

At time $t_B$, $\phi_B$ is at the high level and transistor $T_5$ connects the external plate of $C_L$ to ground, which causes the return of the charges read at time $t_L$ under $C_5$.

By writing the conservation of the charges at the different times on the capacities of the filter, we obtain in the Z plane the transfer function of the filter which is written:

$$\frac{V_S(Z)}{E(Z)} = \frac{G \cdot Z^{(-2+\beta)}}{AZ^{-3} + BZ^{-2} - CZ^{-1} + D}$$

where A, B, C, D and G are constants which are expressed as a function of the values of $C_5$, $C_6$, $C_7$ and $C_8$, and where $\beta = t_B - t_L$.

The filter obtained has a low-frequency response similar to that of a filter of the second order. At the Nyquist frequency, there exists a real pole, but it does not interfere with the low-frequency operation.

Figure 8:
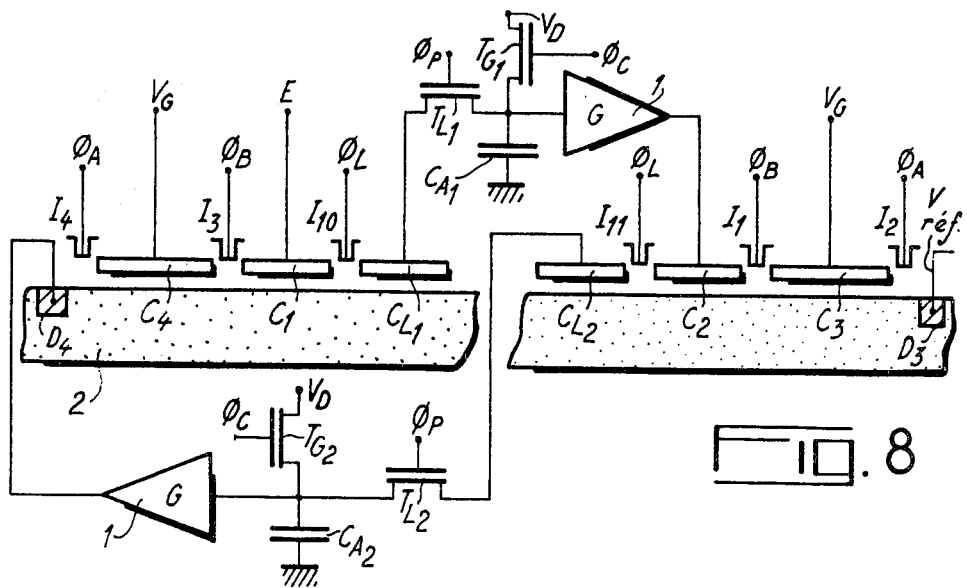
FIG. 8, another embodiment in accordance with the invention of a charge-transfer switched-capacity filter corresponding to the filter of FIGS. 1 and 2.

FIG. 8 shows another embodiment in accordance with the invention of a charge-transfer switched-capacity filter corresponding to the filter of FIGS. 1 and 2.

FIG. 8 differs from FIG. 3 solely by the reinjection and reading devices used. The devices used in FIG. 8 are the same as the one which is used in FIG. 6 for the low-pass filter.

Thus, the surface potential under $C_1$ and $C_2$ is read thanks to a transfer of charges under two reading capacities $CL_1$ and $CL_2$ separated from $C_1$ and $C_2$ by switches $I_{10}$ and $I_{11}$ receiving $\phi_L$. As in the case of FIG. 6, the transfer of the charges under the reading capacities $CL_1$ and $CL_2$ is provided by MOS transistors connected between the external plate of $C_1$ and $C_2$ and ground and controlled by $\phi_L$ and the return of the charges under $C_1$ and $C_2$ is provided by MOS transistors connected between the external plate of $CL_1$ and $CL_2$ and ground and controlled by $\phi_B$. These transistors are not shown in FIG. 8.

It would be similarly possible to use the reinjection reading device of FIG. 3 for the construction of a charge-transfer switched-capacity filter corresponding to FIGS. 4 and 5.

Finally, it will be readily understood that the diagrams of FIGS. 1 and 4 are only given by way of example and that the invention is applicable to filters whose electrical diagram is commonplace and only comprises resistors and capacities associated with an amplifier.

What is claimed is:

1. A charge-transfer switched-capacity filter, comprising an amplifier associated with a network of resistances and capacities in which each resistance is formed by two MOS switches in series and with a capacity between the common point of these switches and ground; said capacities are formed by MOS technology and said MOS switches are formed by control electrodes adjacent the MOS capacities and from which they are separated by an oxide layer; one plate of each capacity being formed by the semiconductor substrate on which it is integrated, and connection between two capacities whose plates are formed by the substrate are periodically connected by transfer of charges in the semiconductor substrate on which said two capacities are integrated, and results in the establishment of the same surface potential under said two capacities; the other external to the substrate plate of at least one of the capacities receiving input voltage of the filter, and of at least another of the capacities receiving a DC voltage taken for reference.

2. A filter according to claim 1 further comprising a reinjection and reading device between one external plate of a capacity termed a reading capacity, and the plate formed by the substrate of another capacity for reading the surface potential under said other capacity.

3. The filter as claimed in claim 2, wherein said reinjection and reading device is formed by a voltage-follower stage whose input is connected to a diode formed in the semiconductor substrate on which a capacity is integrated and whose output is connected to the external plate of another capacity.

4. The filter as claimed in claim 3, wherein said voltage-follower stage is formed by two MOS transistors in series between a supply voltage and ground, one of said transistors being an enrichment mode, and the other a depletion mode, and both having a control electrode, the input of the stage taking place on the control electrode of the MOS enrichment transistor connected to the supply voltage and the output of the stage taking place on the electrode common to the two transistors, whereas the control electrode of the depletion MOS transistor connected to ground is also connected to ground.

5. The filter as claimed in claim 2, wherein the reinjection and reading device comprises:
    an MOS reading capacity integrated on the substrate following the capacity whose surface potential is to be read, an MOS switch ensuring the connection between these two capacities;
    an MOS transistor connected between the external plate of the capacity to be read and ground, this transistor being enabled while the switch allows the transfer of the charges from the capacity to be read to the reading capacity;
    a stage, connected to the external plate of the reading capacity ensuring the maintenance of a constant potential on the external plate of the reading capacity during transfer of the charges under this capacity, this stage being connected, directly or through said amplifier, to the external plate of another capacity.

6. The filter as claimed in claim 5, wherein said stage is formed by an MOS transistor operating under saturation connected between the external plate of the reading capacity and a predetermined point and by a capacity between said point and ground, this capacity being periodically charged before the arrival of the charges under the reading capacity and discharged by the arrival of the charges under the reading capacity.

7. The filter as claimed in claim 6, wherein an MOS transistor connected between the external plate of the reading capacity and ground ensures periodically the return of the charges from the reading capacity to the capacity to be read and wherein an MOS transistor connected between said point and a supply voltage ensures periodically the charging of the capacity connected to said point.

8. The filter as claimed in claim 7, wherein a continuous-level translator stage is connected to said point and translates the continuous level of the signal obtained at said point from $v_{AO}$, which is the voltage at the terminals of the capacity connected to said point before the arrival of the charges under the reading capacity, to $V_G$, which is the DC voltage taken for reference.

9. The filter as claimed in claim 8, whose electrical diagram is formed by two capacities $C_1$ and $C_2$ in series with the input of the amplifier, a resistor between the input of the amplifier and ground and a looping resistor formed from two switches and a capacity $C_4$ between the output of the amplifier and the point common to capacities $C_1$ and $C_2$, wherein the plate formed by the substrate of capacity $C_1$ is connected according to the electrical diagram to the external plate of capacity $C_2$, and wherein a reinjection and reading device is connected between the plate formed by the substrate of $C_1$ and the external plate of $C_2$.

10. The filter as claimed in claim 9, wherein the plate formed by the substrate of $C_2$ is connected, according to the electrical diagram, through the amplifier and a switch to the plate formed by the substrate of $C_4$ and wherein a reinjection and reading device is connected between the plate formed by the substrate of capacity $C_2$ and the amplifier, the amplifier being connected to a charge-injection diode integrated in the same substrate and downstream in the charge-transfer direction of capacity $C_4$ from which it is separated by a switch.

11. The filter as claimed in claim 8, whose electrical diagram is formed from two resistors in series with the input of the amplifier, a capacity $C_5$ between the input of the amplifier and ground and a looping capacity $C_6$ between the output of the amplifier and the point common to the two resistors, wherein the plate formed by the substrate of capacity $C_5$ is connected, in the electrical diagram, through the amplifier to the external plate of capacity $C_6$ and wherein a reinjection and reading device is connected between the plate formed by the substrate of $C_5$ and the input of the amplifier which is connected to the external plate of capacity $C_6$.

* * * * *